(12) United States Patent
Khesbak et al.

(10) Patent No.: US 10,277,177 B2
(45) Date of Patent: *Apr. 30, 2019

(54) VARIABLE LOAD POWER AMPLIFIER SUPPORTING DUAL-MODE ENVELOPE TRACKING AND AVERAGE POWER TRACKING PERFORMANCE

(71) Applicant: SKYWORKS SOLUTIONS, INC., Woburn, MA (US)

(72) Inventors: Sabah Khesbak, Irvine, CA (US); Florinel G. Balteanu, Irvine, CA (US); Hardik Bhupendra Modi, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/000,877

(22) Filed: Jun. 5, 2018

(65) Prior Publication Data

US 2018/0287573 A1 Oct. 4, 2018

Related U.S. Application Data

(63) Continuation of application No. 14/824,679, filed on Aug. 12, 2015, now Pat. No. 9,991,856.

(Continued)

(51) Int. Cl.
*H03F 3/21* (2006.01)
*H03F 3/24* (2006.01)
(Continued)

(52) U.S. Cl.
CPC ............ *H03F 3/211* (2013.01); *H03F 1/0227* (2013.01); *H03F 1/223* (2013.01); *H03F 1/34* (2013.01);
(Continued)

(58) Field of Classification Search
CPC .......... H03F 3/211; H03F 3/193; H03F 3/245; H03F 3/72; H03F 1/0227; H03F 1/223;
(Continued)

(56) References Cited

U.S. PATENT DOCUMENTS

| 8,818,305 B1* | 8/2014 | Schwent | H03F 1/0227 330/127 |
| 2003/0016082 A1* | 1/2003 | Matsunaga | H03F 1/0261 330/133 |

(Continued)

*Primary Examiner* — Junpeng Chen
(74) *Attorney, Agent, or Firm* — Chang & Hale LLP

(57) ABSTRACT

A variable load power amplifier that improves the performance of a power amplifier that provides both envelope tracking (ET) and average power tracking (APT). The variable load power amplifier can include a plurality of amplifiers that are each selectively connectable into one of a plurality of parallel combinations, each of the plurality of parallel combinations characterized by a corresponding load line. The variable load power amplifier can also include a plurality of control elements arranged to selectively connect one or more of the plurality of amplifiers into one of the plurality of parallel combinations, each of the plurality of control elements having a respective input terminal provided to receive a respective control signal, each of the plurality of control elements responsive to the respective control signal.

20 Claims, 11 Drawing Sheets

Related U.S. Application Data

(60) Provisional application No. 62/055,614, filed on Sep. 25, 2014.

(51) Int. Cl.
  *H03F 3/72* (2006.01)
  *H03F 1/02* (2006.01)
  *H03F 1/22* (2006.01)
  *H03F 3/193* (2006.01)
  *H04B 1/04* (2006.01)
  *H03F 1/34* (2006.01)

(52) U.S. Cl.
  CPC ............... *H03F 3/193* (2013.01); *H03F 3/24* (2013.01); *H03F 3/245* (2013.01); *H03F 3/72* (2013.01); *H04B 1/0475* (2013.01); *H03F 2200/102* (2013.01); *H03F 2200/451* (2013.01); *H03F 2203/21145* (2013.01); *H03F 2203/21175* (2013.01); *H03F 2203/7209* (2013.01); *H03F 2203/7236* (2013.01); *H04B 2001/0433* (2013.01)

(58) Field of Classification Search
  CPC ............. H03F 1/0475; H03F 2200/102; H03F 2200/451; H03F 2203/21145; H03F 2203/21175; H03F 2203/7209; H03F 2203/7236; H04B 2001/0433
  See application file for complete search history.

(56) References Cited

U.S. PATENT DOCUMENTS

| | | | | |
|---|---|---|---|---|
| 2010/0327969 | A1* | 12/2010 | Jung | H03F 1/0277 330/124 R |
| 2014/0203869 | A1* | 7/2014 | Khlat | H03F 1/0227 330/75 |
| 2016/0013767 | A1* | 1/2016 | Lin | H03F 1/0222 330/251 |
| 2016/0065139 | A1* | 3/2016 | Lee | H03F 1/0227 330/278 |

* cited by examiner

VARIABLE LOAD POWER AMPLIFIER SUPPORTING DUAL-MODE ENVELOPE TRACKING AND AVERAGE POWER TRACKING PERFORMANCE

CROSS-REFERENCE TO RELATED APPLICATION(S)

This application is a continuation of U.S. patent application Ser. No. 14/824,679 filed Aug. 12, 2015, entitled VARIABLE LOAD POWER AMPLIFIER SUPPORTING DUAL-MODE ENVELOPE TRACKING AND AVERAGE POWER TRACKING PERFORMANCE, which claims priority to U.S. Provisional Application No. 62/055,614 filed Sep. 25, 2014, entitled VARIABLE LOAD POWER AMPLIFIER SUPPORTING DUAL-MODE ENVELOPE TRACKING AND AVERAGE POWER TRACKING PERFORMANCE, the disclosure of each of which is hereby expressly incorporated by reference herein in its entirety.

BACKGROUND

Field

The present disclosure generally relates to wireless communication systems and, more specifically, to improving the functionality and efficiency of power amplifiers therein.

Description of Related Art

Power amplifiers (PAs) are widely used in networks in order to set the transmission power level of an information-bearing signal. For example, PAs are used to set the pulse emission energy of lasers in optical networks. PAs are also included in various wireless network devices—such as base stations and mobile devices—in order to set the transmission power level of a radio-frequency (RF) signal. PAs are also used in local area networks in order to enable wired and wireless connectivity of various devices.

Managing PA operation is a concern in mobile devices because PA operation often characterizes the signal transmissions of a mobile device. As such, a PA is designed to satisfy performance goals driven by its intended use. Yet, design choices that satisfy some performance goals can be detrimental to others. For example, efficiency and output power are often competing performance goals. In turn, previously available PAs designs tend to prioritize one of output power and efficiency. PA designs that prioritize efficiency are often based on envelope tracking (ET), while PA designs that prioritize output power are often based on average power tracking (APT). ET includes adjusting the voltage supply of a PA in relation to the envelope of an input RF signal amplified by the PA, while APT includes adjusting the voltage supply based on the average output power of the PA. A PA designed to use ET typically has a higher load line in order to operate with higher efficiency. A PA designed to use APT typically has a lower load line in order to deliver more saturated power.

ET and APT each have advantages for respective signaling configurations. So it can be useful to enable switching between ET and APT in response to real-time signaling configuration changes. Using previously known technology, such switching involves two distinct PA modules, which is costly and increases the component count and device size. Consequently, a tradeoff is often made in which only one of an ET or APT based PA is selected. If an ET-based PA is selected, the PA will exhibit undesirable output power performance for some signaling configurations. If an APT-based PA is selected, the PA will typically exhibit undesirable efficiency performance for other signaling configurations. In both cases, the selected PA will fall short of satisfying respective performance measures for various corresponding signaling conditions.

SUMMARY

The various implementations described herein include devices, arrangements, and methods that improve the performance of a power amplifier that provides both envelope tracking (ET) and average power tracking (APT). Numerous details are described herein in order to provide a thorough understanding of the example implementations illustrated in the accompanying drawings. The invention may be practiced without many of the specific details described herein. Moreover, well-known methods, components, and circuits have not been described in exhaustive detail so as not to unnecessarily obscure more pertinent aspects of the implementations described herein.

For example, one implementation includes a variable load power amplifier including a plurality of amplifiers that are each selectively connectable into one of a plurality of parallel combinations, each of the plurality of parallel combinations characterized by a corresponding load line. The variable load power amplifier also includes a plurality of control elements arranged to selectively connect one or more of the plurality of amplifiers into one of the plurality of parallel combinations, each of the plurality of control elements having a respective input terminal provided to receive a respective control signal, each of the plurality of control elements responsive to the respective control signal.

In some implementations, the variable load power amplifier further includes a control bus coupled to the respective input terminals of the plurality of control elements in order to provide the respective control signals that effect selection of the plurality of amplifiers.

In some implementations, each of the plurality of amplifiers is connectable to a common input node in order to receive a common input signal provided to a selection of one or more of the plurality of amplifiers.

In some implementations, the variable load power amplifier further includes inter-stage impedance matching provided to deliver the common input signal to the common input node of the plurality of amplifiers.

In some implementations, the variable load power amplifier further includes a drive stage, where the inter-stage impedance matching is coupled between the drive stage and the common input node of the plurality of amplifiers.

In some implementations, each of the plurality of amplifiers is connectable to a common output node in order to transmit an output signal produced by a selection of one or more of the plurality of amplifiers.

In some implementations, at least one of the plurality of control elements includes a differential amplifier coupled to receive the respective control signal, and connect or disconnect one of the plurality of amplifiers into or from a particular parallel combination in response to receiving the respective control signal.

In some implementations, at least one of the plurality of parallel combinations has a relatively high load line suitable for use with an envelope tracking module coupled between an input to the plurality of amplifiers and the voltage supply of the plurality of amplifiers.

In some implementations, at least one of the plurality of parallel combinations has a relatively low load line suitable for use with an average power tracking module coupled between a common output of the plurality of amplifiers and the voltage supply of the plurality of amplifiers.

In some implementations, the present disclosure relates to a variable load power amplifier module that includes a packaging substrate configured to receive a plurality of components. The variable load power amplifier module also includes a variable load power amplifier arranged on the packing substrate, the variable load power amplifier including a plurality of amplifiers that are each selectively connectable into one of a plurality of parallel combinations, each of the plurality of parallel combinations presenting a corresponding load line. The variable load power amplifier module further includes a performance mode controller coupled to the variable load power amplifier, the performance mode controller configured to provide one or more control signals to the variable load power amplifier in order to produce a particular load line for a corresponding performance mode.

In some implementations, the variable load power amplifier module further includes a plurality of control elements provided to effect the selection of one or more of the plurality of amplifiers in response to receiving the one or more control signals and a control bus coupled between the performance mode controller and the plurality of control elements.

In some implementations, the variable load power amplifier module further includes an envelope tracking module coupled between a common input of the plurality of amplifiers and a common voltage supply node of the plurality of amplifiers, and configured to provide an envelope signal to the common voltage supply node.

In some implementations, the performance mode controller is further configured to support the envelope tracking module in a corresponding mode of operation, and provide a combination of one or more control signals to the variable load power amplifier in order to effect the selection of one or more of the plurality of amplifiers that in combination have a relatively high load line suitable for use with the envelope tracking module.

In some implementations, the variable load power amplifier module further includes an average power tracking module coupled between a common output of the plurality of amplifiers and a common voltage supply node of the plurality of amplifiers, and configured to adjust a DC voltage level on the common voltage supply node.

In some implementations, the performance mode controller is further configured to support the average power tracking module in a corresponding mode of operation, and provide a combination of one or more control signals to the variable load power amplifier in order to effect the selection of one or more of the plurality of amplifiers that in combination have a relatively low load line suitable for use with the average power tracking module.

In some implementations, each of the plurality of amplifiers is connectable to a common input node in order to receive a common input signal provided to a selection of one or more of the plurality of amplifiers, and/or each of the plurality of amplifiers is connectable to a common output node in order to transmit an output signal produced by a selection of one or more of the plurality of amplifiers.

According to some teachings, the present disclosure relates to a radio-frequency (RF) device that includes a transceiver configured to process RF signals. The RF device also includes an antenna in communication with the transceiver configured to facilitate transmission of an amplified RF signal. The RF device further includes a variable load power amplifier module connected to the transceiver and configured to generate the amplified RF signal, the variable load power amplifier module including a plurality of amplifiers that are each selectively connectable into one of a plurality of parallel combinations, each of the plurality of parallel combinations presenting a corresponding load line.

In some implementations, the RF device is a wireless device.

In some implementations, the wireless device includes at least one of a base station, a repeater, a cellular phone, a smartphone, a computer, a laptop, a tablet computer, and peripheral device.

In some implementations, the RF device further includes a performance mode controller coupled to the variable load power amplifier, the performance mode controller configured to provide control signals to the variable load power amplifier in order to produce a particular load line for a corresponding performance mode.

In some implementations, the performance mode controller is further configured to support: an envelope tracking module in a first mode of operation, and provide a combination of control signals to the variable load power amplifier in order to effect the selection of one or more of the plurality of amplifiers that in combination have a relatively high load line suitable for use with the envelope tracking module; and an average power tracking module in a second mode of operation, and provide a combination of control signals to the variable load power amplifier in order to effect the selection of one or more of the plurality of amplifiers that in combination have a relatively low load line suitable for use with the average power tracking module.

In some implementations, each of the plurality of amplifiers is connectable to a common input node in order to receive a common input signal provided to a selection of one or more of the plurality of amplifiers, and/or each of the plurality of amplifiers is connectable to a common output node in order to transmit an output signal produced by a selection of one or more of the plurality of amplifiers.

In some implementations, the present disclosure relates to a method of operating a variable load amplifier. The method can include receiving a mode selection signal, the mode selection signal indicating a preference for one of envelope tracking performance and average power tracking performance. The method can also include generating a combination of control signals in response to receiving the mode selection signal, the generated combination of control signals representing a selection of a particular parallel combination of one or more of a plurality of amplifiers having a characteristic load line value suitable for one of envelope tracking performance and average power tracking performance based on the mode selection signal. The method can further include providing the combination of control signals to a respective plurality of control elements in order to effect the selection of one or more of the plurality of amplifiers.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

Figure 1:
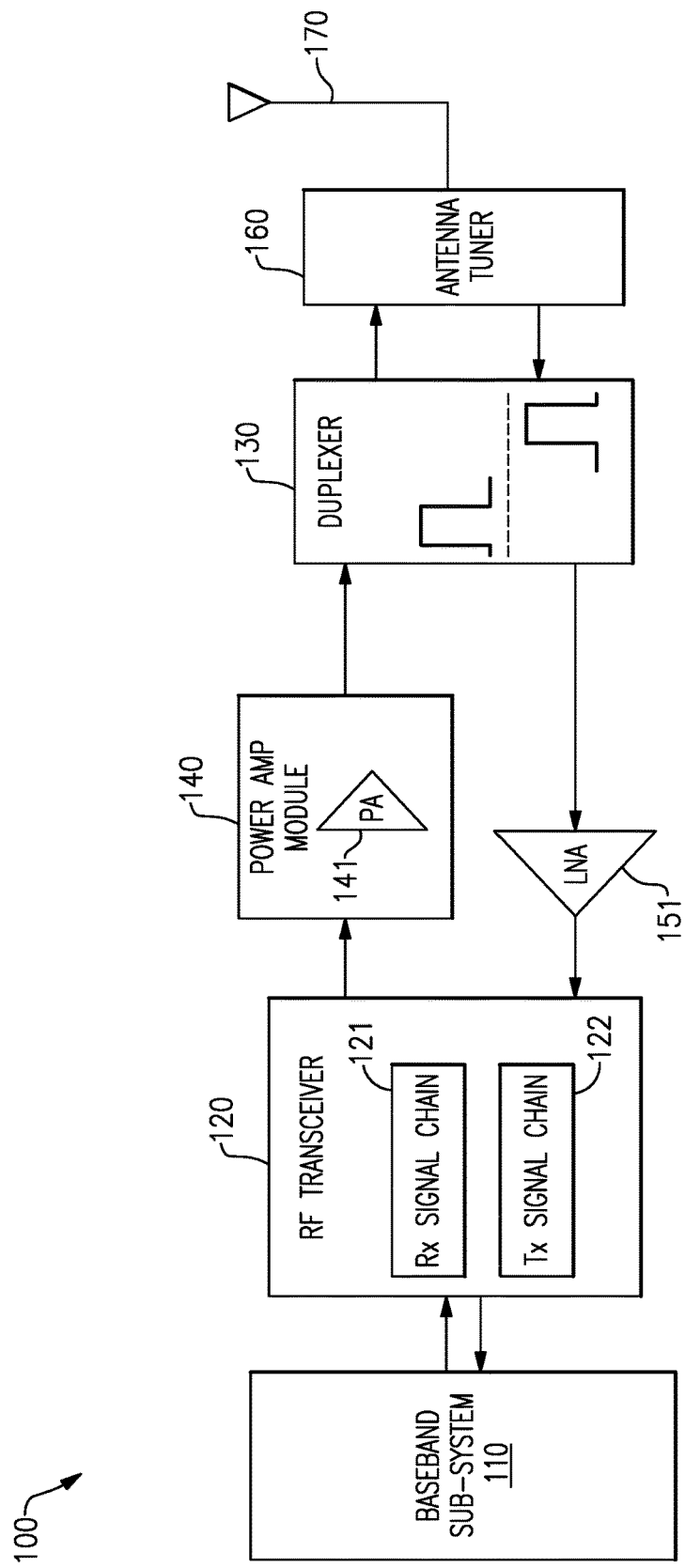
FIG. 1 is a block diagram of a portion of a wireless device including a power amplifier module in accordance with some implementations.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION OF SOME IMPLEMENTATIONS

The headings provided herein, if any, are for convenience only and do not necessarily affect the scope or meaning of the claimed invention.

Power amplifiers (PAs) are used in communication networks to set the transmission level of data signals. For example, power amplifiers are used to set transmission pulse laser energy in optical communication networks. Power amplifiers are used in radio-frequency (RF) components of wireless devices—e.g., base stations and mobile devices—to set the power level transmitted through an antenna. Power amplifiers are also used in local area networks to support connectivity of servers, computers, laptops, and peripheral devices.

FIG. 1 is a block diagram of a portion of a wireless device 100 including a power amplifier module in accordance with some implementations. While pertinent features are illustrated, those skilled in the art will appreciate from the present disclosure that various other features have not been illustrated for the sake of brevity and so as not to obscure more pertinent aspects of the example implementations disclosed herein. To that end, the wireless device 100 includes a baseband sub-system 110, a RF transceiver 120, a duplexer 130, a PA module 140, a low noise amplifier (LNA) 151, a tuner circuit 160, and an antenna 170.

The tuner circuit 160 is coupled between the antenna 170 and the duplexer 130. The RF transceiver 120 is coupled in series between the baseband sub-system 110 and the parallel paths provided by the PA module 140 and the LNA 151. The RF transceiver 120 includes a transmit signal chain 122 and a receive signal chain 121. The LNA 151 couples the antenna tuner 160 to the receive signal chain 121 through the duplexer 130. Similarly, the PA module 140 couples the transmit signal chain 122 to the antenna tuner 160 through the duplexer 130. The PA module 140 includes a PA 141, which is used to set the power level of data signals provided by the transmit signal chain 122 and transmitted through the antenna 170.

In some implementations, the tuner circuit 160 is configured to enable adjustable impedance matching between the antenna 170 and the remainder of the wireless device 100. In other words, the tuner circuit 160 is operable to set and present an antenna load impedance ($Z_{antenna}$) to the remainder of the wireless device 100.

In some implementations, the transmit signal chain 122 is configured to up-convert a modulated signal received from the baseband sub-system 110 to a carrier frequency. In some implementations, the receive signal chain 121 is configured to down-convert a modulated signal, and provide the down-converted signal to the baseband sub-system 110. The duplexer 130 is configured to provide frequency domain isolation between transmitted RF signals and received RF signals so that the transmit signal chain 122 and the receive signal chain 121 can be used simultaneously.

The PA 141 is typically designed to satisfy performance goals driven by the intended use of the wireless device 100. For example, efficiency and output power are often competing performance goals for various signaling configurations, and previously available PAs designs tend to prioritize one or the other. PA designs that prioritize efficiency are often based on envelope tracking (ET), while PA designs that prioritize output power are often based on average power tracking (APT). An ET-based PA typically has a higher load line in order to operate with higher efficiency, while an APT-based PA typically has a lower load line in order to deliver more saturated power. ET and APT each have advantages for respective signaling configurations. So it can be useful to enable switching between ET and APT performance in response to real-time signaling configuration changes. However, using previously available PA designs, such switching involves two distinct PA modules, which is costly and increases the component count and device size. Consequently, a tradeoff is often made in which only one of an ET or APT-based PA is selected. If an ET-based PA is selected, the PA will exhibit undesirable output power performance for some signaling configurations. On the other hand, if an APT-based PA is selected, the PA will typically exhibit undesirable efficiency performance for other signaling configurations.

By contrast, the various implementations described herein include systems, methods and devices configured to provide a variable load power amplifier operable to support dual-mode ET and APT performance without the attendant cost, complexity and component count of two distinct PA modules. More specifically, some implementations include a variable load power amplifier (VLPA) that includes a number of amplifiers that are each selectively connectable into one of a number of parallel combinations. Each of the parallel combinations is characterized by a corresponding load line suitable for a particular performance mode.

Figure 2:
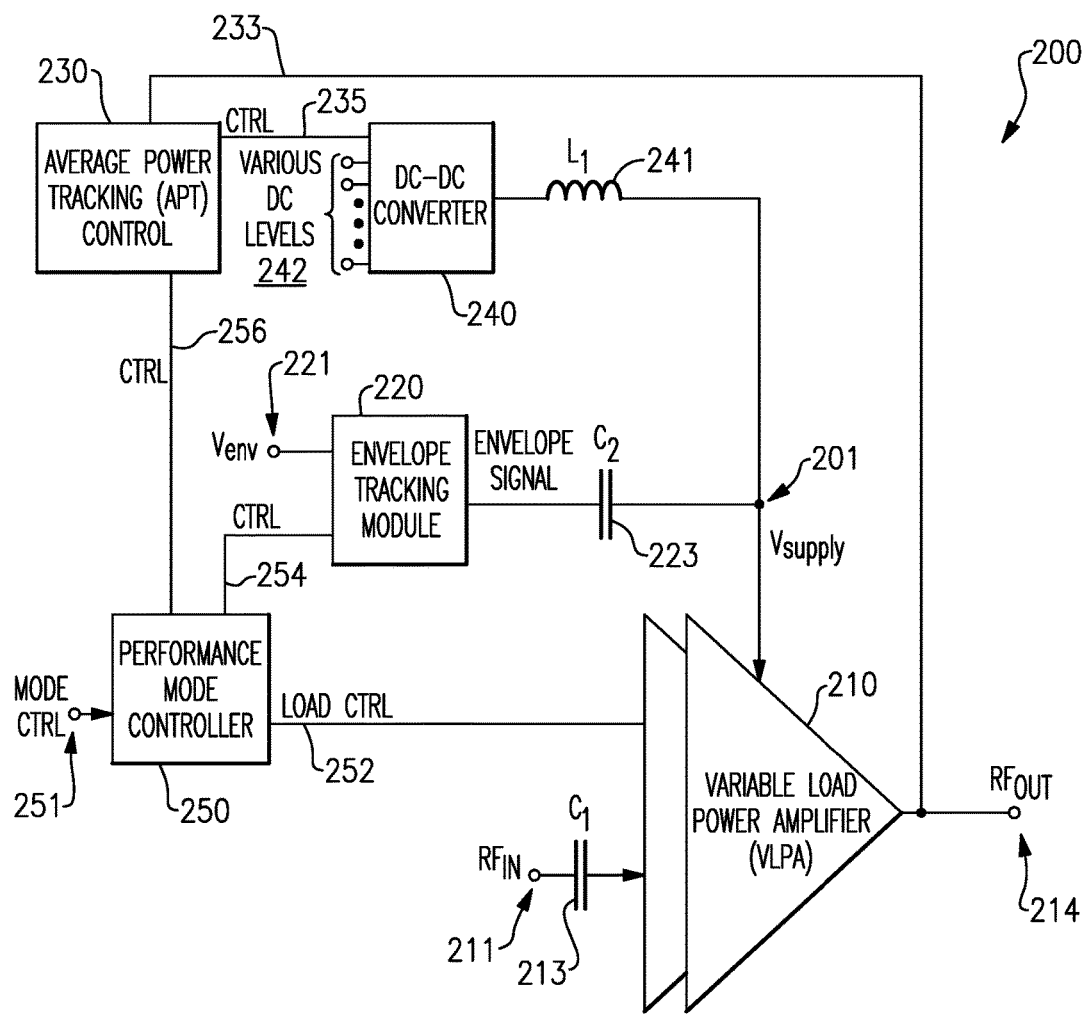
FIG. 2 is a schematic diagram of a variable load power amplifier operating configuration in accordance with some implementations.

To these ends, FIG. 2 is a diagram of a VLPA operating configuration 200 according to some implementations. While pertinent features are illustrated, those skilled in the art will appreciate that various other features have not been illustrated for the sake of brevity and so as not to obscure more pertinent aspects of the disclosed example. As a non-limiting example, the VLPA operating configuration 200 includes a VLPA 210, a performance mode controller 250, an ET module 220, an APT control module 230, and a DC-DC converter 240.

The VLPA 210 is arranged to receive a RF input signal ($RF_{in}$), from input node 211, through coupling capacitor 213 ($C_1$), and to provide an amplified RF output signal ($RF_{out}$) on output node 214. In various implementations, the capacitor 213 ($C_1$) is implemented as a single capacitor or a multi-component capacitive circuit arrangement. The VLPA 102 also has a voltage supply node 201 provided to receive a voltage supply level.

The performance mode controller 250 is coupled to the VLPA 210 through control line 252. In some implementations, the control line 252 includes a control bus coupled to the respective input terminals of control elements included in the VLPA 210 (shown in FIGS. 3A and 3B). The performance mode controller 250 is configured to provide one or more control signals to the VLPA 210 in order to produce particular load lines for respective performance modes. The performance mode controller 250 is also coupled to the ET module 220 through control line 254, and to the APT control module 230 through control line 256. Control signals on the respective control lines 254, 256 are provided to enable the operation of the corresponding ET and APT modules 220, 230. The performance mode controller 250 also includes a mode control input node 251. Input signals received on mode control input node 251 switch the VLPA operating configuration 200 between various performance modes. As described in greater detail with reference to FIGS. 3A and 3B, in one performance mode, the VLPA 210 is operated to have a relatively high load line suitable for use with the ET module 220. In another performance mode, the VLPA 210 is operated to have a relatively low load line suitable for use with the combination of the APT control module 230 and the DC-DC converter 240.

The ET module 220 is coupled to the voltage supply node 201 through capacitor 223 ($C_2$). The ET module 220 also includes an input node 221 provided to receive a voltage envelope (i.e., envelope signal, $V_{env}$) of the RF input signal ($RF_{in}$).

The APT control module 230 is configured to control the operation of the DC-DC converter 240 using at least one control signal provided on control line 235. The APT control module 230 is also coupled to receive an indication of the average output power of the VLPA 210 on input line 233, which is coupled to the output node 214 of the VLPA 210. The DC-DC converter 240 is coupled to the voltage supply node 201 of the VLPA 210 through inductor 241 ($L_1$). The DC-DC converter 240 is provided to supply an adjustable DC voltage level the voltage supply node 201 of the VLPA 210 in response to a control signal from the APT control module 230. In some implementations, the DC-DC converter 240 supplies the adjustable DC voltage level by switching between DC voltage levels supplied to inputs 242.

Figure 3A:
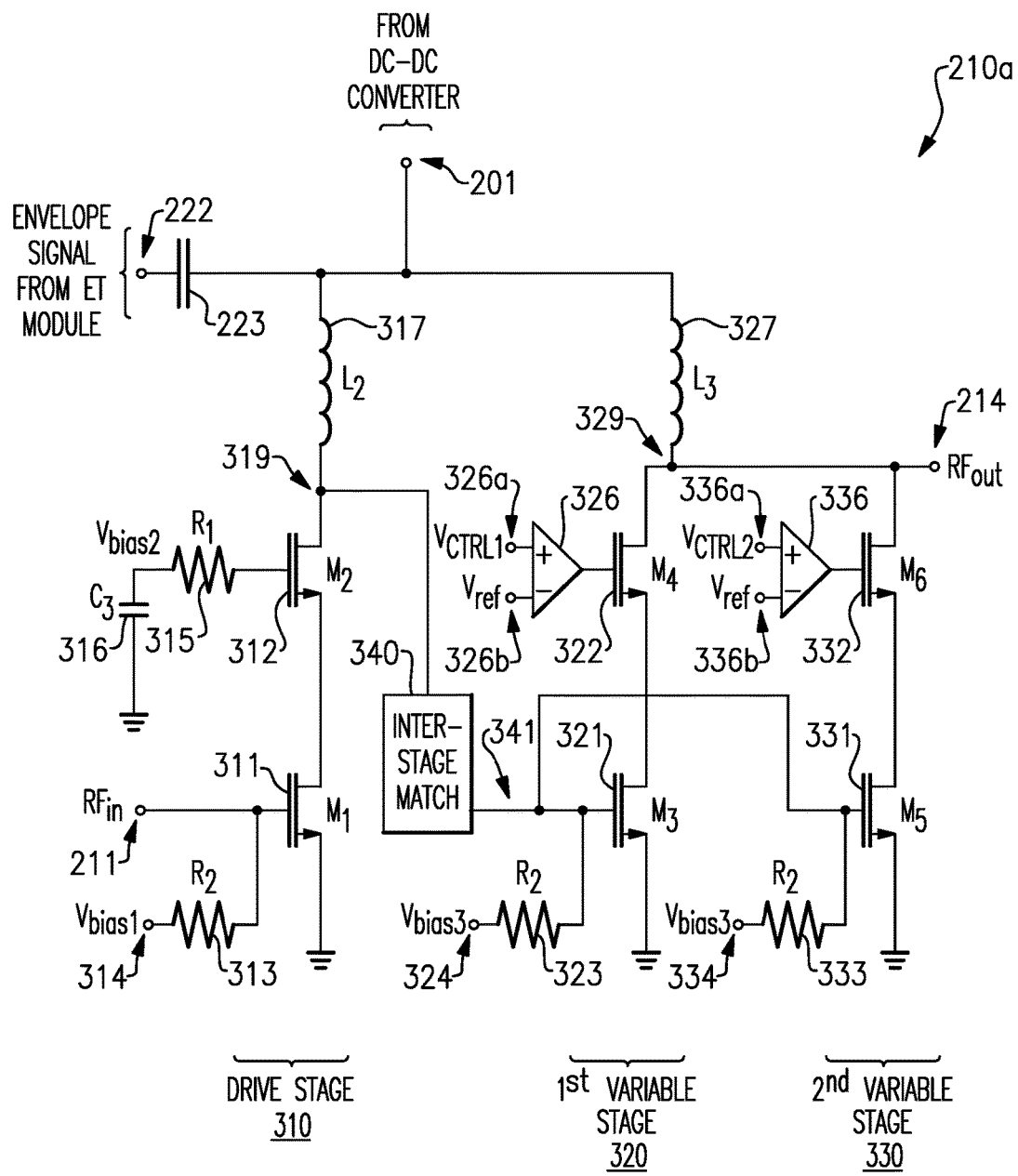
FIG. 3A is a more detailed schematic diagram of the variable load power amplifier of FIG. 2 in accordance with some implementations.

FIG. 3A is a schematic diagram of a VLPA 210a in accordance with some implementations that use CMOS transistors. Elements common to FIGS. 2 and 3A include common reference numbers. And again, while certain specific features are illustrated, those skilled in the art will appreciate from the present disclosure that various other features have not been illustrated for the sake of brevity and so as not to obscure more pertinent aspects of the example disclosed herein.

In some implementations, the VLPA 210a includes a drive stage 310, an inter-stage matching network 340, and a number of amplifiers that are each selectively connectable into one of a number of parallel combinations using a corresponding control elements. The control elements are arranged to selectively connect one or more of the amplifiers into one of the parallel combinations. Each of the control elements has a respective input terminal provided to receive a respective control signal.

The drive stage 310 includes first and second NMOS transistors 311, 312 coupled source-to-drain between the voltage supply node 201 and ground.

An inductor 317 ($L_2$) is provided between the voltage supply node 201 and the drain of the second NMOS transistor 312, which is also labeled as node 319. The gate of the second NMOS transistor 312 is coupled to receive a voltage bias ($V_{bias2}$) provided via the series combination of a capacitor 316 ($C_3$) and a resistor 315 ($R_1$). The gate of the first NMOS transistor 311 is coupled to receive the RF input signal ($RF_{in}$) from node 211 (see FIG. 2), and a voltage bias ($V_{bias1}$) from node 311 through a resistor 313 ($R_2$).

The output of the drive stage 310 is provided from node 319 to an inter-stage matching network 340. The output of the inter-stage matching network 340 is coupled to a common input node 341 of the plurality of amplifiers. While those of ordinary skill in the art will appreciate that a plurality of amplifiers includes any number of two or more amplifiers, for the sake of a brief example only the plurality of amplifiers in FIG. 3A includes merely a first variable stage amplifier 320 and a second variable stage amplifier 330 selectively operable in a parallel combination. Similarly, merely two corresponding control elements 326, 336 have been provided in association with the first and second variable stage amplifiers 320, 330.

The first variable stage amplifier 320 includes third and fourth NMOS transistors 321, 322 coupled source-to-drain between the voltage supply node 201 and ground. An inductor 327 ($L_3$) is provided between the voltage supply node 201 and the drain of the fourth NMOS transistor 322, which is also labeled as common node 329. The gate of the fourth NMOS transistor 322 is coupled to the respective control element 326. The gate of the third NMOS transistor 321 is coupled to receive a RF input from the inter-stage matching network 340 on common input node 341, and a voltage bias ($V_{bias3}$) from node 324 through a resistor 323 ($R_2$). Similarly, the second variable stage amplifier 330 includes fifth and sixth NMOS transistors 331, 332 coupled source-to-drain between the voltage supply node 201 and ground. The inductor 327 ($L_3$) is provided between the voltage supply node 201 and the drain of the sixth NMOS transistor 332, which is also labeled as common node 329. The gate of the sixth NMOS transistor 332 is coupled to the respective control element 336. The gate of the fifth NMOS transistor 331 is coupled to receive a RF input from the inter-stage matching network 340 on common input node 341, and a voltage bias ($V_{bias3}$) from node 334 through a resistor 333 ($R_2$).

As shown in FIG. 3A, in some implementations, the control elements 326, 336 each include a respective differential amplifier. To that end, the control element 326, 336 each include respective control inputs 326a, 336a provided to receive corresponding control signals ($V_{CTRL1}$, $V_{CTRL2}$) originating from the performance mode controller 250. The control elements 326, 336 also each include respective reference inputs 326b, 336b provided to receive reference voltage levels ($V_{ref}$). In some implementations, the VLPA 210a includes a control bus coupled to the respective input terminals of the plurality of control elements (e.g., 326, 336) in order to provide the respective control signals that effect selection of the plurality of amplifiers.

In operation, control signals ($V_{CTRL1}$, $V_{CTRL2}$) are used to enable or disable each of the first and second variable stage amplifiers 320, 330. In other words, the plurality of control elements arranged to selectively connect one or more of the plurality of amplifiers into one of the plurality of parallel combinations, each of the plurality of control elements having a respective input terminal provided to receive a respective control signal, each of the plurality of control elements responsive to the respective control signal. As such, each of the plurality of amplifiers is connectable to the common output node 329 in order to transmit an output signal produced by a selection of one or more of the plurality of amplifiers.

With reference to FIGS. 2 and 3A, in some implementations, the performance mode controller 250 is further configured to support the ET module 220 in a corresponding mode of operation. To that end, the performance mode controller 250 provides a combination of one or more control signals to the VLPA 210a in order to effect the selection of one or more of the plurality of amplifiers that in combination have a relatively high load line suitable for use with the ET module 220. Similarly, in some implementations, the performance mode controller 250 is further configured to support the APT control module 230 in a corresponding mode of operation. To that end, the performance mode controller 250 provides a combination of one or more control signals to the VLPA 210a in order to effect the selection of one or more of the plurality of amplifiers that in combination have a relatively low load line suitable for use with the APT control module 230.

Figure 3B:
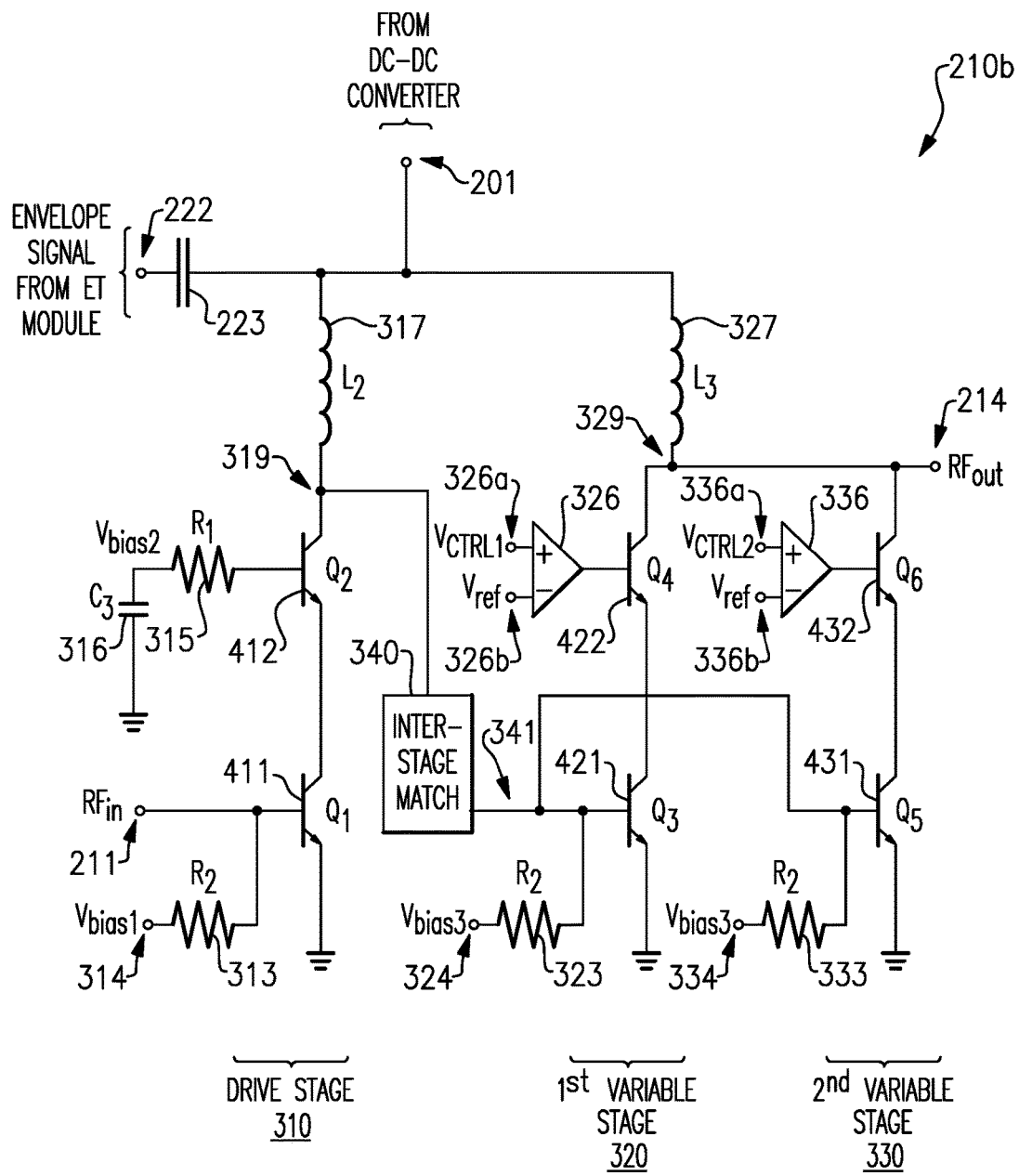
FIG. 3B is another more detailed schematic diagram of the variable load power amplifier of FIG. 2 in accordance with some implementations.

FIG. 3B is a schematic diagram of a VLPA 210b that uses heterojunction bipolar transistors (HBTs) in accordance with some implementations. Elements common to FIGS. 3A and 3B include common reference numbers, and only the differences are described herein for the sake of brevity. To that end, as compared to the VLPA 210a of FIG. 3A, the VLPA 210b of FIG. 3B includes six HBTs 411, 412, 421, 422, 431, 433 in place of the six NMOS transistors 311, 312, 321, 322, 331, 333 used in the VLPA 210a of FIG. 3A.

As described above, in operation, control signals ($V_{CTRL1}$, $V_{CTRL2}$) are used to enable or disable each of the first and second variable stage amplifiers 320, 330. In other words, the plurality of control elements arranged to selectively connect one or more of the plurality of amplifiers into one of the plurality of parallel combinations, each of the plurality of control elements having a respective input terminal provided to receive a respective control signal, each of the plurality of control elements responsive to the respective control signal. As such, each of the plurality of amplifiers is connectable to the common output node 329 in order to transmit an output signal produced by a selection of one or more of the plurality of amplifiers.

Figure 4:
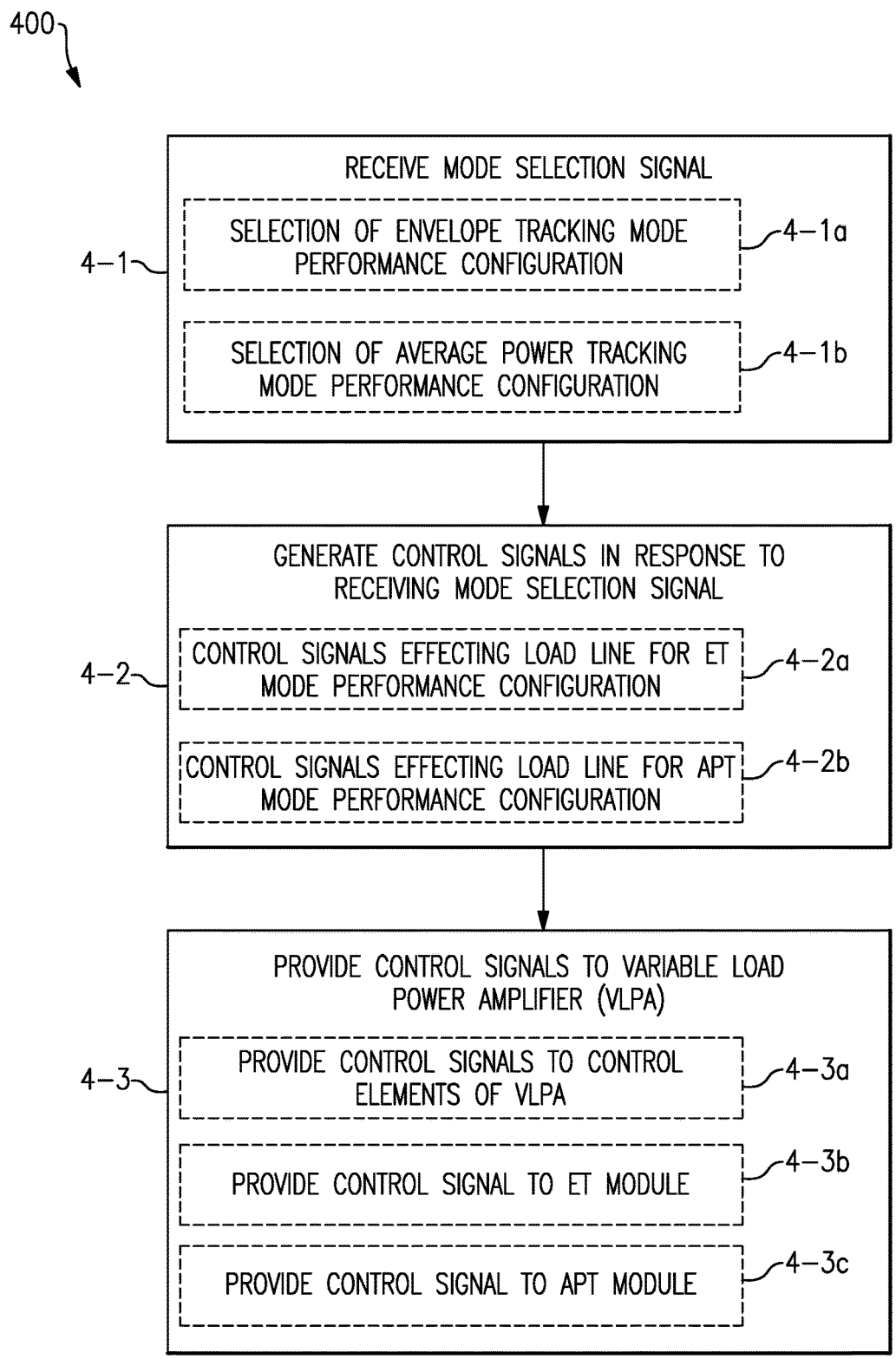
FIG. 4 is flowchart of an implementation of a method of operating the variable load power amplifier of FIG. 2 in accordance with some implementations.

FIG. 4 is flowchart of an implementation of a method 400 of operating a VLPA in accordance with some implementations. In some implementations, method 400 is performed by a performance management system or controller associated with a VLPA. Briefly, method 400 includes receiving a mode selection signal, and responsively effecting the selection of a characteristic load line value suitable for a respective performance mode.

To that end, as represented by block 4-1, method 400 includes receiving a mode selection signal. For example, as represented by block 4-1a, in some implementations, the mode selection signal indicates the selection of an ET performance mode in which the VLPA is adjusted to have a relatively high load line suitable for use with an ET module. Similarly, as represented by block 4-1b, in some implementations, the mode selection signal indicates the selection of an APT performance mode in which the VLPA is adjusted to have a relatively low load line suitable for use with an APT module.

As represented by block 4-2, method 400 includes generating a combination of control signals in response to receiving the mode selection signal. For example, as represented by block 4-2a, in some implementations, generating the combination of control signals includes generating one or more control signals representing a selection of a particular parallel combination of one or more of a plurality of amplifiers having a characteristic load line value suitable for the ET performance mode. Similarly, as represented by block 4-2b, in some implementations, generating the combination of control signals includes generating one or more control signals representing a selection of a particular parallel combination of one or more of a plurality of amplifiers having a characteristic load line value suitable for the APT performance mode.

As represented by block 4-3, method 400 includes providing the control signals to the VLPA. For example, as represented by block 4-3a, in some implementations, providing the control signals includes providing a combination of one or more control signals to a respective plurality of control elements in order to effect the selection of one or more of the plurality of amplifiers. Additionally, as represented by block 4-3b, in some implementations, providing the control signals includes providing at least one control signal to an ET module. Similarly, as represented by block 4-3b, in some implementations, providing the control signals includes providing at least one control signal to an APT module.

Figure 5:
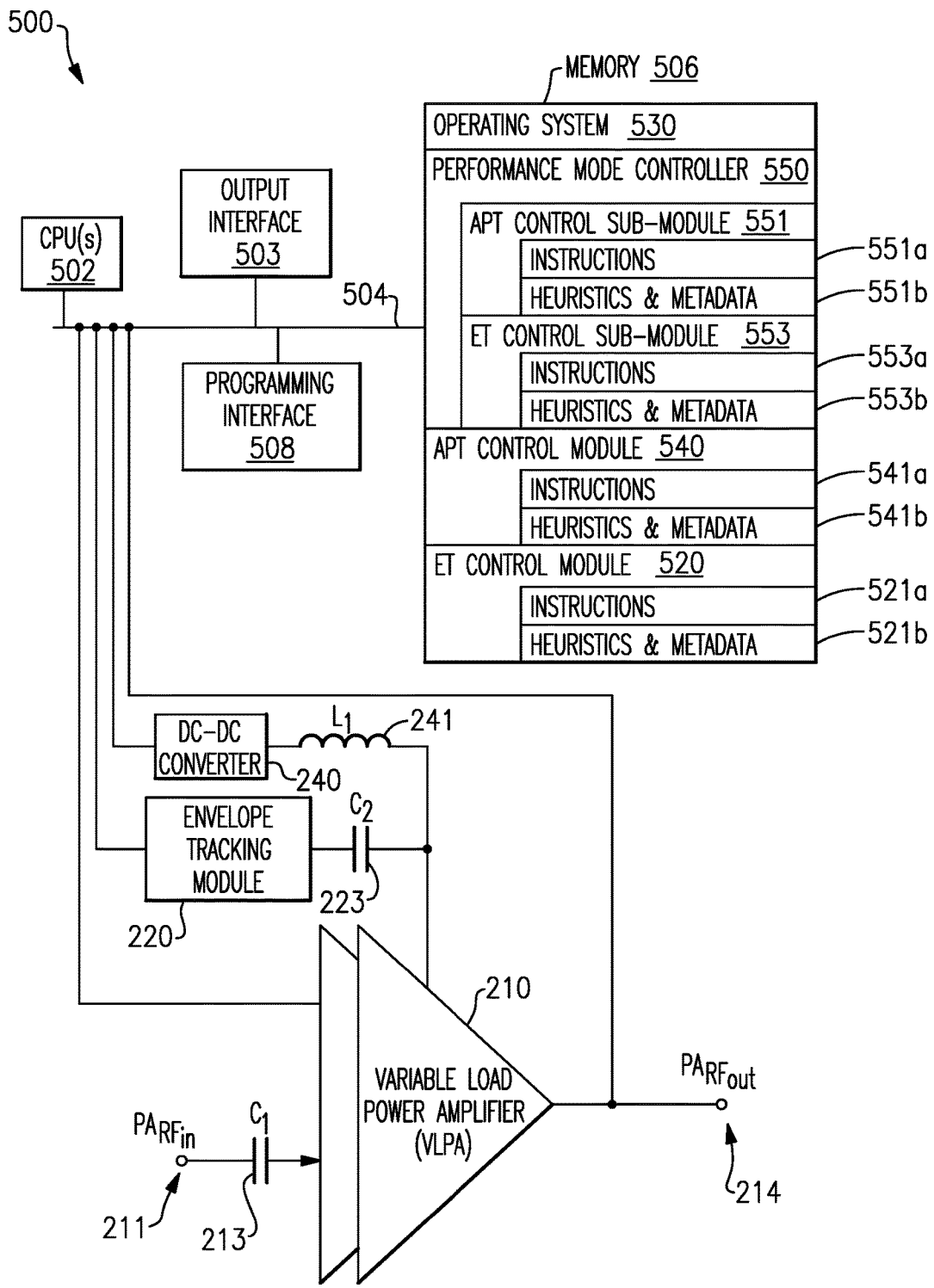
FIG. 5 is a block diagram of a variable load power amplifier operating configuration in accordance with some implementations.

FIG. 5 is a block diagram of a VLPA system 500 in accordance with some implementations. The VLPA system 500 illustrated in FIG. 5 is similar to and adapted from the VLPA operating configuration 200 illustrated in FIG. 2. Elements common to FIG. 2 and FIG. 5 include common reference numbers, and only the differences between FIG. 2 and FIG. 5 are described herein for the sake of brevity. Again, while certain specific features are illustrated, those skilled in the art will appreciate from the present disclosure that various other features have not been illustrated for the sake of brevity and so as not to obscure more pertinent aspects of the example implementations disclosed herein.

To that end, the VLPA system 500 includes an implementation of the VLPA 210, the DC-DC Converter 240, and the ET module 220. Additionally, the VLPA system 500 also includes one or more processing units (CPUs) 502, one or more output interfaces 503, a memory 506, a programming interface 508, and one or more communication buses 504 for interconnecting these and various other components.

In some implementations, the communication buses 504 include circuitry that interconnects and controls communications between system components. The memory 506 includes high-speed random access memory, such as DRAM, SRAM, DDR RAM or other random access solid state memory devices; and may include non-volatile memory, such as one or more magnetic disk storage devices, optical disk storage devices, flash memory devices, or other non-volatile solid state storage devices. The memory 506 optionally includes one or more storage devices remotely located from the CPU(s) 502. The memory 506 comprises a non-transitory computer readable storage medium. In some implementations, the memory 506 or the non-transitory computer readable storage medium of the memory 506 stores the following programs, modules and data structures, or a subset thereof including an optional operating system 530, a performance mode controller 550, an APT control module 540, and an ET control module 520.

The operating system 530 includes procedures for handling various basic system services and for performing hardware dependent tasks.

In some implementations, the performance mode controller 550 includes an APT control sub-module 551, and an ET control sub-module 553.

In some implementations, the APT control sub-module 551 is configured to support an APT performance mode associated with the operation of the VLPA 210. In some implementations, the APT control sub-module 551 is configured to produce one or more control signals in order to effect the selection of one or more of a plurality of amplifiers of the VLPA 210, which in combination have a relatively low load line suitable for use with the APT control module 540. In some implementations, the APT control sub-module 551 is configured to produce at least one control signal to affect the operation of the APT control module 540. To these ends, in some implementations, the APT control sub-module 551 includes a set of instructions 551*a* and heuristics and metadata 551*b*.

In some implementations, the ET control sub-module 553 is configured to support an ET performance mode associated with the operation of the VLPA 210. In some implementations, the ET control sub-module 553 is configured to produce one or more control signals in order to effect the selection of one or more of a plurality of amplifiers of the VLPA 210, which in combination have a relatively high load line suitable for use with the ET control module 520. In some implementations, the ET control sub-module 553 is configured to produce at least one control signal to affect the operation of the ET control module 520. To these ends, in some implementations, the ET control sub-module 553 includes a set of instructions 553*a* and heuristics and metadata 553*b*.

In some implementations, the APT control module 540 is configured to control the operation of the DC-DC converter 240. To this end, in some implementations, the APT control module 540 includes a set of instructions 541*a* and heuristics and metadata 541*b*.

In some implementations, the ET control module 520 is configured to control the operation of the ET module 220. To this end, in some implementations, the ET control module 520 includes a set of instructions 521*a* and heuristics and metadata 521*b*.

Figure 6:
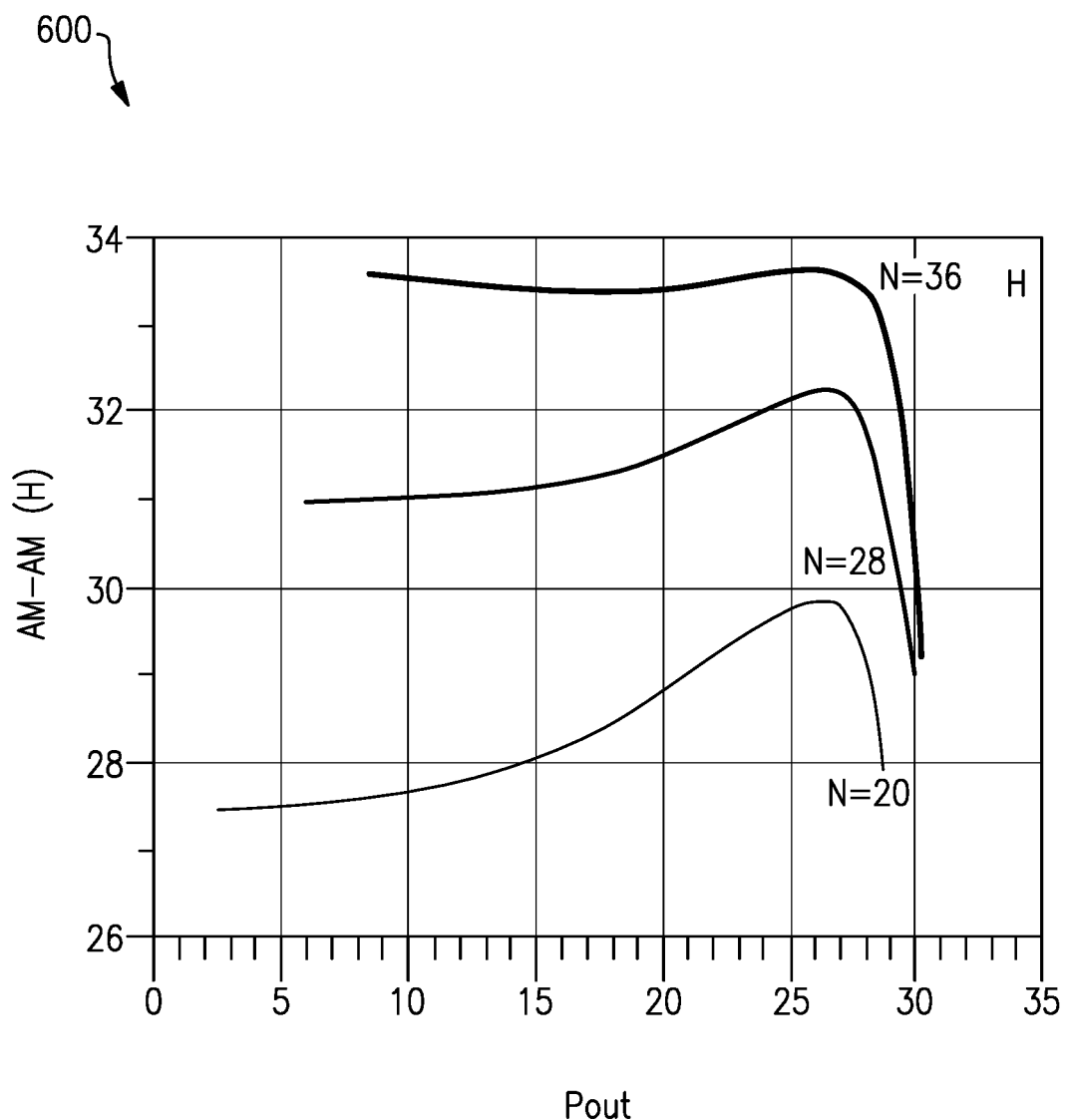
FIG. 6 is a performance diagram showing gain compression of a variable load power amplifier in accordance with some implementations.
Figure 7:
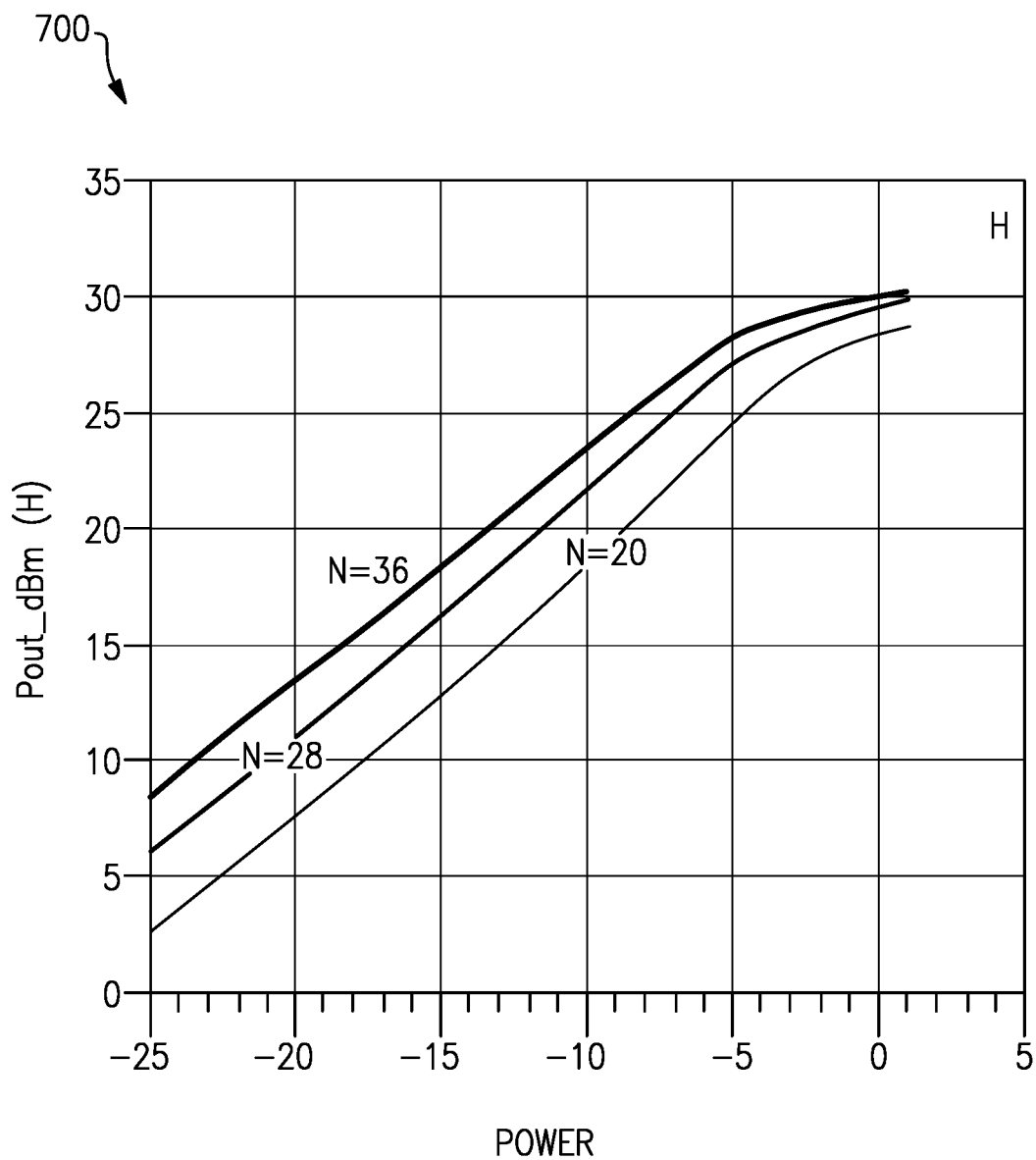
FIG. 7 is a performance diagram showing output power performance of a variable load power amplifier in accordance with some implementations.
Figure 8:
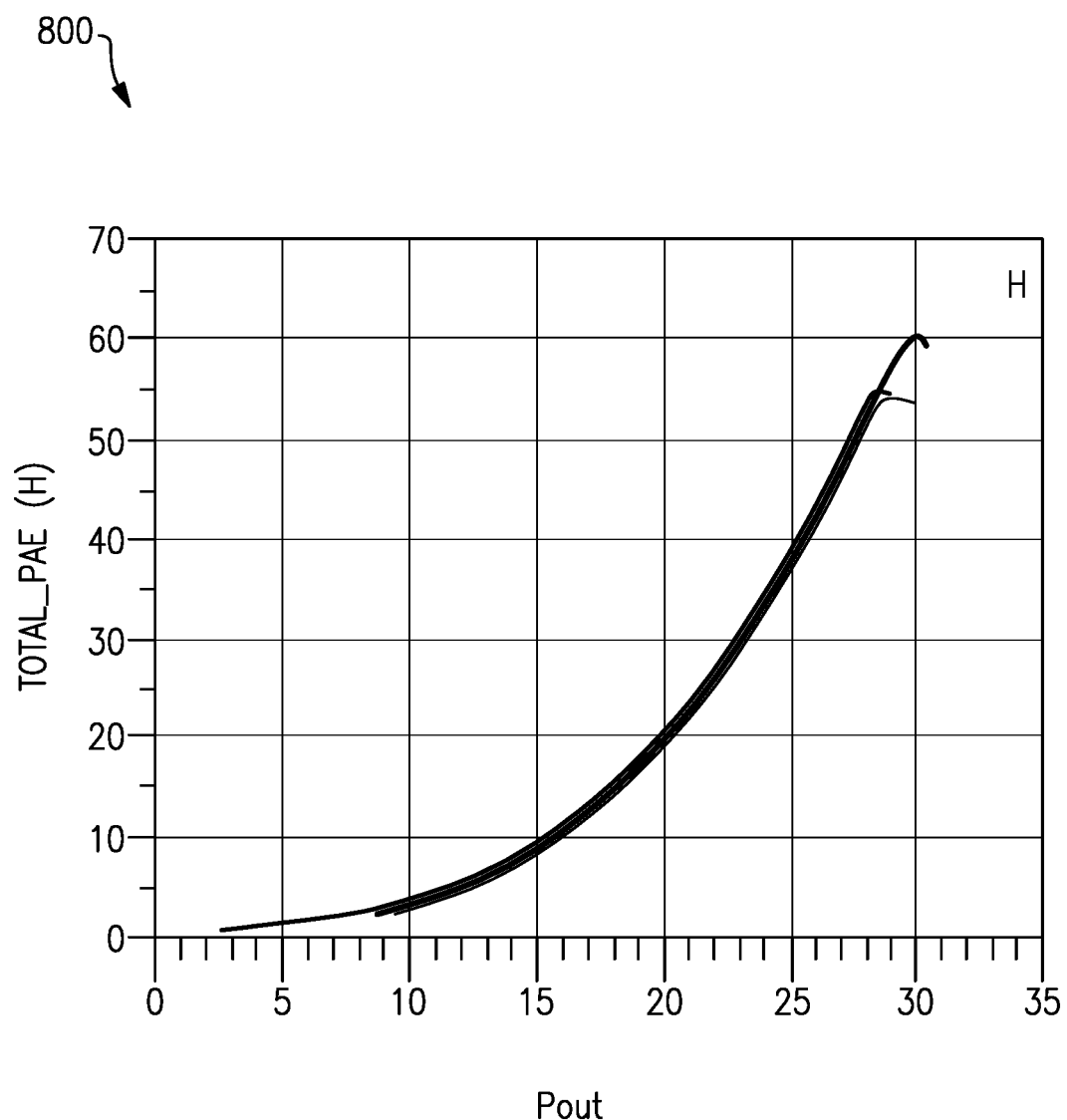
FIG. 8 is a performance diagram showing power added efficiency performance of a variable load power amplifier according to some implementations.

FIG. 6 is a performance diagram 600 showing gain compression of a VLPA in accordance with some implementations. In some implementations, as the number of amplifiers (N) increases in a VLPA, the amplitude-to-amplitude gain increases as does the output power level at which the gain begins to fall off. FIG. 7 is a performance diagram 700 showing output power performance of a variable load power amplifier in accordance with some implementations. In some implementations, as the number of amplifiers (N) increases in a VLPA, the output power increases as a function of power. FIG. 8 is a performance diagram 800 showing power added efficiency performance of a variable load power amplifier according to some implementations. In some implementations, as the number of amplifiers (N) increases in a VLPA, the total power added efficiency is linear over a larger range of output power values.

Figure 9A:
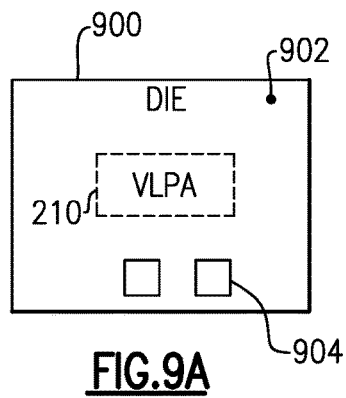
FIGS. 9A-9C are schematic diagrams of different integrated circuit implementations of the variable load power amplifier of FIGS. 2 and 3A-3B.
Figure 9B:
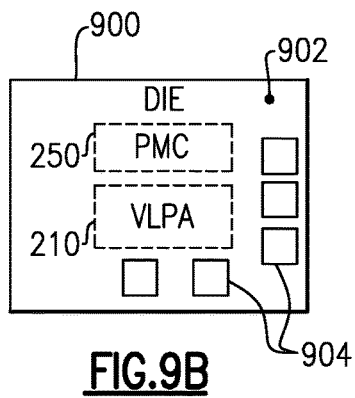
Figure 9C:
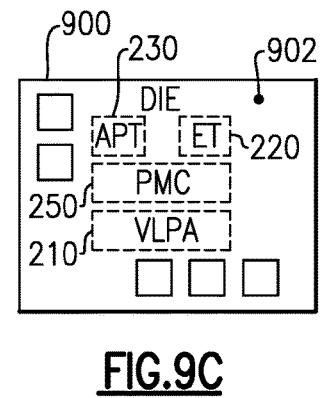

FIGS. 9A-9C are block diagrams of various integrated circuit implementations of the VLPA 210 of FIG. 2 according to some implementations. While some example features are illustrated, those skilled in the art will appreciate from the present disclosure that various other features have not been illustrated for the sake of brevity and so as not to obscure more pertinent aspects of the example implementations disclosed herein. To that end, for example, FIG. 9A shows that in some implementations, some or all portions of the VLPA 210 can be part of a semiconductor die 900. By way of an example, the VLPA 210 can be formed on a substrate 902 of the die 900. A plurality of connection pads 904 can also be formed on the substrate 902 to facilitate functionalities associated with some or all portions of the VLPA 210.

FIG. 9B shows that in some implementations, a semiconductor die 900 having a substrate 902 can include some or all portions of the performance mode controller 250 and some or all portions of the VLPA 210. A plurality of connection pads 904 can also be formed on the substrate 902 to facilitate functionalities associated with some or all portions of the performance mode controller 250 and some or all portions of the VLPA 210.

FIG. 9C shows that in some implementations, a semiconductor die 900 having a substrate 902 can include some or all portions of the VLPA 210, some or all portions of the performance mode controller 250, some or all portions of the APT control module 230, and some or all portions of the ET module 220. A plurality of connection pads 904 can also be formed on the substrate 902 to facilitate functionalities associated with some or all portions of the VLPA 210, the performance mode controller 250, the APT control module 230, and the ET module 220.

Figure 10:
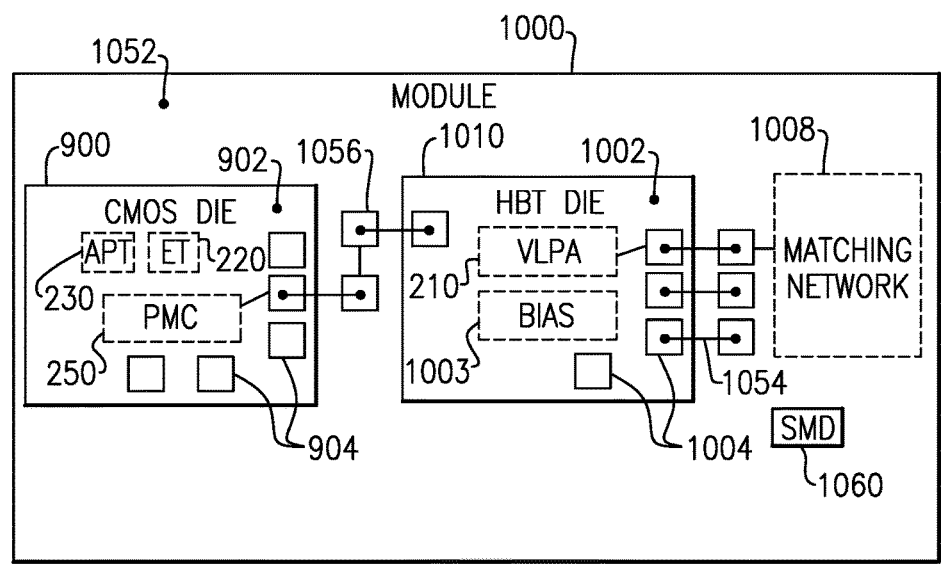
FIG. 10 is a schematic diagram of an implementation of a module including the variable load power amplifier of FIGS. 2 and 3A-3B.

In some implementations, one or more features described herein can be included in a module. FIG. 10 is a schematic diagram of an implementation of a module 1000 including the VLPA 210 of FIG. 2 according to some implementations. While some example features are illustrated, those skilled in the art will appreciate from the present disclosure that various other features have not been illustrated for the sake of brevity and so as not to obscure more pertinent aspects of the example implementations disclosed herein. The module 1000 includes a packaging substrate 1052, connection pads 1056, a CMOS (complementary metal oxide semiconductor) die 900, a HBT (heterojunction bipolar transistor) die 1010, a matching network 1008, and one or more surface mount devices 1060.

The CMOS die 900 includes a substrate 902 including some or all portions of at least one of the performance mode controller 250, the APT control module 230, and the ET module 220. A plurality of connection pads 904 is formed on the substrate 902 to facilitate functionalities associated with some or all portions of at least one of the performance mode controller 250, the APT control module 230, and the ET module 220. Similarly, the HBT die 1010 includes a substrate 1002 including some or all portions of the VLPA 210 and some or all portions of the bias circuitry 1003 provided to set the quiescent conditions of the VLPA 210. The HBT die 1010 also includes a plurality of connection pads 1004 formed on the substrate 1002 to facilitate functionalities associated with some or all portions of the VLPA 210 and some or all portions of the bias circuitry 1003.

The connection pads 1056 on the packaging substrate 1052 facilitate electrical connections to and from each of the CMOS die 900 and the HBT die 1010. For example, the connection pads 1056 facilitate the use of wirebonds 1054 for passing various signals and supply currents and/or voltages to each of the CMOS die 900 and the HBT die 1010.

In some implementations, the components mounted on the packaging substrate 1052 or formed on or in the packaging substrate 1052 can further include, for example, one or more surface mount devices (SMDs) (e.g., 1060) and one or more matching networks (e.g., 1008). In some implementations, the packaging substrate 1052 can include a laminate substrate.

In some implementations, the module 1000 can also include one or more packaging structures to, for example, provide protection and facilitate easier handling of the module 1000. Such a packaging structure can include an overmold formed over the packaging substrate 1052 and dimensioned to substantially encapsulate the various circuits and components thereon.

It will be understood that although the module 1000 is described in the context of wirebond-based electrical connections, one or more features of the present disclosure can also be implemented in other packaging configurations, including flip-chip configurations.

In some implementations, a device and/or a circuit having one or more features described herein can be included in an RF device such as a wireless device. Such a device and/or a circuit can be implemented directly in the wireless device, in a modular form as described herein, or in some combination thereof. In some implementations, such a wireless device can include, for example, a cellular phone, a smartphone, a hand-held wireless device with or without phone functionality, a wireless tablet, a wireless router, a wireless access point, a wireless base station, etc. That is, those skilled in the art will also appreciate from the present disclosure that in various implementations the low frequency loss correction module may be included in various devices, such as a computer, a laptop computer, a tablet device, a netbook, an internet kiosk, a personal digital assistant, an optical modem, a base station, a repeater, a wireless router, a mobile phone, a smartphone, a gaming device, a computer server, or any other computing device. In various implementations, such devices include one or more processors, one or more types of memory, a display and/or other user interface components such as a keyboard, a touch screen display, a mouse, a track-pad, a digital camera and/or any number of supplemental devices to add functionality.

Figure 11:
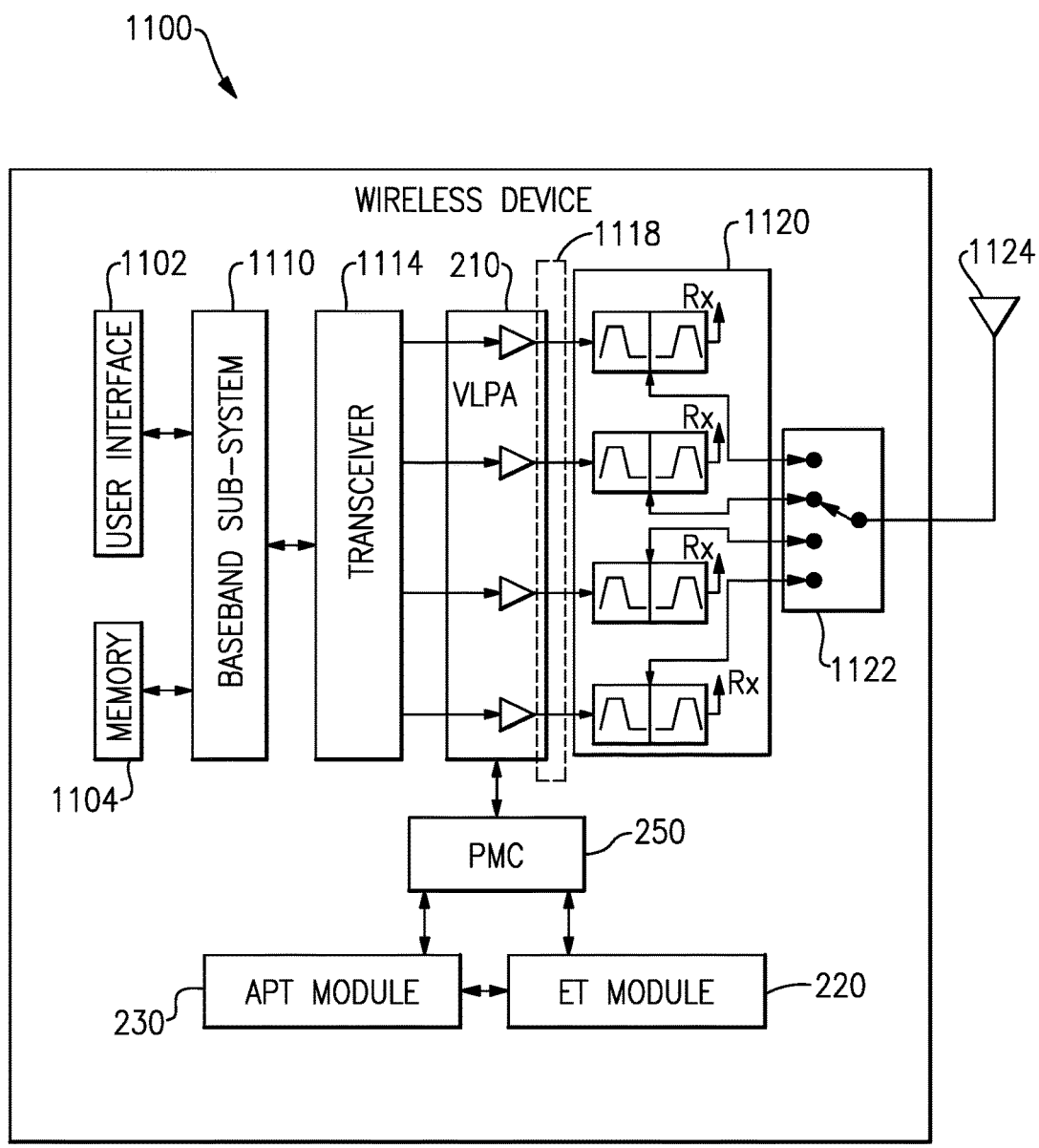
FIG. 11 is a schematic diagram of an implementation of a wireless device including the variable load power amplifier of FIGS. 2 and 3A-3B.

FIG. 11 is a schematic diagram of an implementation of a wireless device 1100 including one or more features described herein, such as the VLPA 210 of FIG. 2, in accordance with some implementations. While some example features are illustrated, those skilled in the art will appreciate from the present disclosure that various other features have not been illustrated for the sake of brevity and so as not to obscure more pertinent aspects of the example implementations disclosed herein.

One or more VLPAs 210 as described herein are biased by respective bias circuit(s) (not shown) and compensated by respective compensation circuit(s) (not shown). In some implementations the VLPAs 210 are packaged into a module including matching circuits 1118. The VLPAs 210 can receive respective RF signals from a transceiver 1114, that can be configured and operated in known manners to generate RF signals to be amplified and transmitted, and to process received signals. The transceiver 1114 is shown to interact with a baseband sub-system 1110 that is configured to provide conversion between data and/or voice signals suitable for a user and RF signals suitable for the transceiver 1114. The VLPAs 210 are also shown to be connected to the performance mode controller 250. Additionally, the performance mode controller 250 is coupled to the ET module 220 and the APT module 230.

The baseband sub-system 1110 is shown to be connected to a user interface 1102 to facilitate various input and output of voice and/or data provided to and received from the user. The baseband sub-system 1110 can also be connected to a memory 1104 that is configured to store data and/or instructions to facilitate the operation of the wireless device, and/or to provide storage of information for the user.

In the example wireless device 1100, outputs of the VLPAs 210 are shown to be matched and routed to an antenna 1124 via respective duplexers 1120 and a band-selection switch 1122. The band-selection switch 1122 can include, for example, a single-pole-multiple-throw (e.g., SP4T) switch to allow selection of an operating band (e.g., Band 2). In some implementations, each duplexer 1120 can allow transmit and receive operations to be performed simultaneously using a common antenna (e.g., 1124).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

While various aspects of implementations within the scope of the appended claims are described above, it should be apparent that the various features of implementations described above may be embodied in a wide variety of forms and that any specific structure and/or function described above is merely illustrative. Based on the present disclosure one skilled in the art should appreciate that an aspect described herein may be implemented independently of any other aspects and that two or more of these aspects may be combined in various ways. For example, an apparatus may be implemented and/or a method may be practiced using any number of the aspects set forth herein. In addition, such an apparatus may be implemented and/or such a method may be practiced using other structure and/or functionality in addition to or other than one or more of the aspects set forth herein.

It will also be understood that, although the terms "first," "second," etc. may be used herein to describe various elements, these elements should not be limited by these terms. These terms are only used to distinguish one element from another. For example, a first power amplifier could be termed a second power amplifier, and, similarly, a second power amplifier could be termed a first power amplifier, which changing the meaning of the description, so long as all occurrences of the "first power amplifier" are renamed consistently and all occurrences of the "second power amplifier" are renamed consistently. The first power amplifier and the second power amplifier are both power amplifiers, but they are not the same power amplifier.

The terminology used herein is for the purpose of describing particular embodiments only and is not intended to be limiting of the claims. As used in the description of the embodiments and the appended claims, the singular forms "a", "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

What is claimed is:

1. A variable load power amplifier comprising:
   a plurality of amplifiers that are each selectively connectable into one of a plurality of parallel combinations, including a first combination corresponding to an envelope tracking performance mode and a second combination corresponding to an average power tracking performance mode; and
   a plurality of control elements arranged to selectively connect one or more of the plurality of amplifiers into one of the plurality of parallel combinations, each of the plurality of control elements having a respective input terminal provided to receive a respective control signal, each of the plurality of control elements responsive to the respective control signal, the plurality of control elements including an envelope tracking module coupled to a voltage supply of the plurality of amplifiers and an average power tracking module coupled to a DC-DC converter.

2. The variable load power amplifier of claim 1 further comprising a control bus coupled to the respective input terminals of the plurality of control elements in order to provide the respective control signals that effect selection of the plurality of amplifiers.

3. The variable load power amplifier of claim 1 wherein each of the plurality of amplifiers is connectable to a common input node in order to receive a common input signal provided to a selection of one or more of the plurality of amplifiers.

4. The variable load power amplifier of claim 3 further comprising inter-stage impedance matching provided to deliver the common input signal to the common input node of the plurality of amplifiers.

5. The variable load power amplifier of claim 4 further comprising a drive stage, wherein the inter-stage impedance matching is coupled between the drive stage and the common input node of the plurality of amplifiers.

6. The variable load power amplifier of claim 1 wherein each of the plurality of amplifiers is connectable to a common output node in order to transmit an output signal produced by a selection of one or more of the plurality of amplifiers.

7. The variable load power amplifier of claim 1 wherein at least one of the plurality of control elements includes a differential amplifier coupled to receive the respective control signal, and connect or disconnect one of the plurality of amplifiers into or from a particular parallel combination in response to receiving the respective control signal.

8. The variable load power amplifier of claim 1 wherein a first of the plurality of parallel combinations is characterized by a first load line and implementation of the envelope tracking module coupled between an input to the plurality of amplifiers and the voltage supply of the plurality of amplifiers.

9. The variable load power amplifier of claim 1 wherein a second of the plurality of parallel combinations is characterized by a second load line and implementation of the average power tracking module coupled between a common output of the plurality of amplifiers and the voltage supply of the plurality of amplifiers.

10. A variable load power amplifier module comprising:
    a packaging substrate configured to receive a plurality of components;
    a variable load power amplifier arranged on the packing substrate, the variable load power amplifier including a plurality of amplifiers that are each selectively connectable into one of a plurality of parallel combinations, including a first combination corresponding to an envelope tracking performance mode and a second combination corresponding to an average power tracking performance mode; and
    a performance mode controller coupled to the variable load power amplifier, the performance mode controller configured to provide one or more control signals to the variable load power amplifier, an envelope tracking module coupled to a voltage supply of the plurality of amplifiers, and an average power tracking module coupled to a DC-DC converter.

11. The variable load power amplifier module of claim 10 further comprising:
    a plurality of control elements provided to effect selection of one or more of the plurality of amplifiers in response to receiving the one or more control signals; and
    a control bus coupled between the performance mode controller and the plurality of control elements.

12. The variable load power amplifier module of claim 10 further comprising the envelope tracking module coupled between a common input of the plurality of amplifiers and a common voltage supply node of the plurality of amplifiers, and configured to provide an envelope signal to the common voltage supply node.

13. The variable load power amplifier module of claim 12 wherein the performance mode controller is coupled to the envelope tracking module, and is further configured to provide a combination of one or more control signals to the variable load power amplifier in order to effect selection of one or more of the plurality of amplifiers that in combination are characterized by a first load line corresponding to an envelope tracking performance mode.

14. The variable load power amplifier module of claim 10 further comprising the average power tracking module coupled between a common output of the plurality of amplifiers and a common voltage supply node of the plurality of amplifiers, and configured to adjust a DC voltage level on the common voltage supply node.

15. The variable load power amplifier module of claim 14 wherein the performance mode controller is coupled to the average power tracking module, and is further configured to provide a combination of one or more control signals to the variable load power amplifier in order to effect selection of one or more of the plurality of amplifiers that in combination are characterized by a second load line corresponding to an average power tracking performance mode.

16. The variable load power amplifier module of claim 10 wherein:
- each of the plurality of amplifiers is connectable to a common input node in order to receive a common input signal provided to a selection of one or more of the plurality of amplifiers; and
- each of the plurality of amplifiers is connectable to a common output node in order to transmit an output signal produced by the selection of one or more of the plurality of amplifiers.

17. A radio-frequency device comprising:
- a transceiver configured to process radio-frequency signals;
- an antenna in communication with the transceiver configured to facilitate transmission of an amplified radio-frequency signal;
- a variable load power amplifier module connected to the transceiver and configured to generate the amplified radio-frequency signal, the variable load power amplifier module including a plurality of amplifiers that are each selectively connectable into one of a plurality of parallel combinations, including a first combination corresponding to an envelope tracking performance mode and a second combination corresponding to an average power tracking performance mode; and
- a plurality of control elements arranged to selectively connect one or more of the plurality of amplifiers into one of the plurality of parallel combinations, each of the plurality of control elements having a respective input terminal provided to receive a respective control signal, each of the plurality of control elements responsive to the respective control signal, the plurality of control elements including an envelope tracking module coupled to a voltage supply of the plurality of amplifiers and an average power tracking module coupled to a DC-DC converter.

18. The radio-frequency device of claim 17 further comprising a performance mode controller coupled to the variable load power amplifier, the performance mode controller configured to provide control signals to the variable load power amplifier in order to produce a particular load line for a corresponding performance mode.

19. The radio-frequency device of claim 18 wherein the performance mode controller is further configured to support:
- the envelope tracking module in a first mode of operation, and provide a combination of control signals to the variable load power amplifier in order to effect selection of one or more of the plurality of amplifiers that in combination are characterized by a first load line corresponding to the first mode of operation; and
- the average power tracking module in a second mode of operation, and provide a combination of control signals to the variable load power amplifier in order to effect selection of one or more of the plurality of amplifiers that in combination are characterized by a second load line corresponding to the second mode of operation.

20. The radio-frequency device of claim 17 wherein:
- each of the plurality of amplifiers is connectable to a common input node in order to receive a common input signal provided to a selection of one or more of the plurality of amplifiers; and/or
- each of the plurality of amplifiers is connectable to a common output node in order to transmit an output signal produced by a selection of one or more of the plurality of amplifiers.

* * * * *